US012610785B2

(12) United States Patent
Shimizu et al.

(10) Patent No.: US 12,610,785 B2
(45) Date of Patent: Apr. 21, 2026

(54) SEMICONDUCTOR DEVICE AND METHOD FOR MANUFACTURING THE SAME

(71) Applicant: HITACHI, LTD., Tokyo (JP)

(72) Inventors: Haruka Shimizu, Tokyo (JP); Hiromi Shimazu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 761 days.

(21) Appl. No.: 17/920,484

(22) PCT Filed: Feb. 8, 2021

(86) PCT No.: PCT/JP2021/004652
§ 371 (c)(1),
(2) Date: Oct. 21, 2022

(87) PCT Pub. No.: WO2021/229875
PCT Pub. Date: Nov. 18, 2021

(65) Prior Publication Data
US 2023/0142877 A1 May 11, 2023

(30) Foreign Application Priority Data

May 14, 2020 (JP) ................................. 2020-084886

(51) Int. Cl.
*H10P 74/00* (2026.01)
*H10D 62/10* (2025.01)
(Continued)

(52) U.S. Cl.
CPC ........... *H10P 74/23* (2026.01); *H10D 62/117* (2025.01); *H10D 62/8325* (2025.01);
(Continued)

(58) Field of Classification Search
CPC ..... H01L 22/20; H01L 21/6836; H01L 21/78; H01L 23/3672; H01L 25/072;
(Continued)

(56) References Cited

U.S. PATENT DOCUMENTS 8,368,181 B2 2/2013 Suzuki et al.
10,109,549 B2 10/2018 Hirao et al.
(Continued)

FOREIGN PATENT DOCUMENTS

EP 3401954 A1 11/2018
JP H0689932 A * 3/1994
(Continued)

OTHER PUBLICATIONS

Office Action mailed Jul. 30, 2024 in German Application No. 11 2021 001 359.9.
(Continued)

*Primary Examiner* — Thanh T Nguyen
(74) *Attorney, Agent, or Firm* — Miles & Stockbridge, P.C.

(57) ABSTRACT

An accelerated test for applying a high voltage is performed without reducing a manufacturing yield of a semiconductor device using a wide gap semiconductor material. The technical idea in the embodiment is, for example, an idea of performing the accelerated test in the state of a semiconductor wafer to distinguish a latent defect as illustrated in FIG. 4. That is, the technical idea in the embodiment is to perform the accelerated test on a semiconductor chip containing a wide bandgap semiconductor material as a main component not in the state of a semiconductor chip but in the state of the semiconductor wafer.

8 Claims, 19 Drawing Sheets

(51) Int. Cl.

| | | |
|---|---|---|
| *H10D 62/832* | (2025.01) | |
| *H10P 54/00* | (2026.01) | |
| *H10P 72/70* | (2026.01) | |
| *H10W 40/22* | (2026.01) | |
| *H10W 90/00* | (2026.01) | |

(52) U.S. Cl.
CPC .......... *H10P 54/00* (2026.01); *H10P 72/7402* (2026.01); *H10W 40/226* (2026.01); *H10W 90/00* (2026.01); *H10P 72/7416* (2026.01); *H10P 72/7442* (2026.01)

(58) Field of Classification Search
CPC . H01L 2221/68327; H01L 2221/68386; H01L 23/3114; H01L 2221/68336; H01L 21/561; H01L 22/14; H01L 23/3185; H01L 2224/0603; H01L 2224/06181; H01L 2224/40137; H10D 62/117; H10D 62/8325
See application file for complete search history.

(56) References Cited

U.S. PATENT DOCUMENTS

| | | | |
|---|---|---|---|
| 2007/0252169 A1 | 11/2007 | Tokuyama et al. | |
| 2009/0267082 A1* | 10/2009 | Yamamoto | H01L 21/0495 257/77 |
| 2013/0037917 A1 | 2/2013 | Xue | |
| 2014/0312472 A1* | 10/2014 | Ogasawara | H10D 8/422 257/644 |
| 2015/0015285 A1 | 1/2015 | Shinohara et al. | |

FOREIGN PATENT DOCUMENTS

| | | | |
|---|---|---|---|
| JP | H06089932 A | 3/1994 | |
| JP | 2007-299781 A | 11/2007 | |
| JP | 2009-267032 A | 11/2009 | |
| JP | 2016-066701 A | 4/2016 | |
| JP | 2017-212317 A | 11/2017 | |
| WO | 2013168314 A1 | 11/2013 | |
| WO | 2016103335 A1 | 6/2016 | |
| WO | WO-2017119064 A1 * | 7/2017 | H01L 25/18 |

OTHER PUBLICATIONS

K. Honda et al., "Expanding Film and process for high efficiency 5 sides protection and FO-WLP fabrication", Electronic Components & Technology Conference, 2017.
Search Report mailed May 11, 2021 in International Application No. PCT/JP2021/004652.
Written Opinion mailed May 11, 2021 in International Application No. PCT/JP2021/004652.

* cited by examiner

FIG. 1

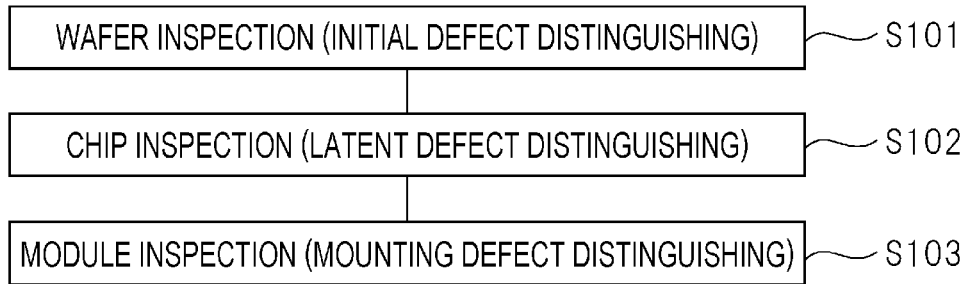

| WAFER INSPECTION (INITIAL DEFECT DISTINGUISHING) | ~S101 |
| CHIP INSPECTION (LATENT DEFECT DISTINGUISHING) | ~S102 |
| MODULE INSPECTION (MOUNTING DEFECT DISTINGUISHING) | ~S103 |

FIG. 2

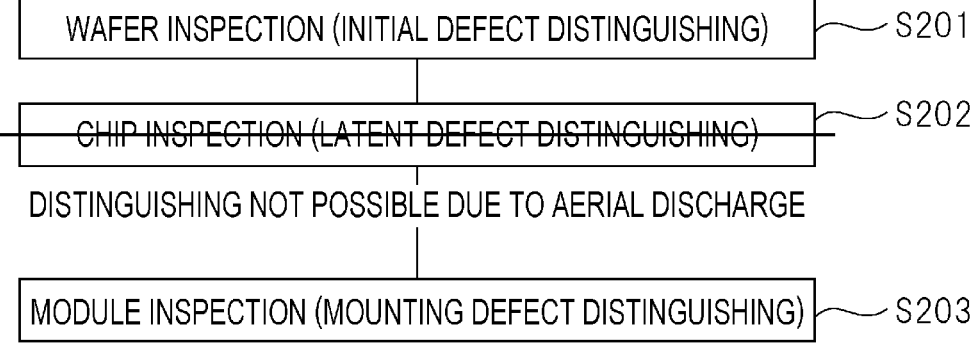

| WAFER INSPECTION (INITIAL DEFECT DISTINGUISHING) | ~S201 |
| ~~CHIP INSPECTION (LATENT DEFECT DISTINGUISHING)~~ | ~S202 |
| DISTINGUISHING NOT POSSIBLE DUE TO AERIAL DISCHARGE | |
| MODULE INSPECTION (MOUNTING DEFECT DISTINGUISHING) | ~S203 |

DECREASE IN PACKAGE YIELD

WAFER INSPECTION (INITIAL DEFECT DISTINGUISHING)  —— S501

CHIP INTEGRATION INSPECTION (LATENT DEFECT DISTINGUISHING)  —— S502

MODULE INSPECTION (MOUNTING DEFECT DISTINGUISHING)  —— S503

SEMICONDUCTOR DEVICE AND METHOD FOR MANUFACTURING THE SAME

TECHNICAL FIELD

The present invention relates to a semiconductor device and a technique for manufacturing the same, and for example, relates to an effective technique applied to a semiconductor device including a semiconductor chip containing, as a main component, a wide bandgap semiconductor material having a bandgap larger than that of silicon.

BACKGROUND ART

JP 2007-299781 A (PTL 1) describes a technique for sealing a semiconductor chip with a resin.

WO 2016/103335 A (PTL 2) describes a technique for applying a resin only to an end portion of a chip region of a semiconductor wafer or a chip end portion of a semiconductor chip by a dispenser.

NPL 1 describes a technique for dicing a semiconductor wafer and then sealing a plurality of singulated semiconductor chips together with a dicing tape with a resin.

CITATION LIST

Patent Literature

PTL 1: JP 2007-299781 A
PTL 2: WO 2016/103335 A

Non-Patent Literature

NPL 1: K. Honda et al., "Expanding Film and process for high efficiency 5 sides protection and FO-WLP fabrication Electronic Components & Technology Conference, 2017"

SUMMARY OF INVENTION

Technical Problem

For example, in an inverter which is a component of a power conversion device, it is desired to reduce the on-resistance while ensuring the breakdown voltage to reduce the loss of the inverter. In this regard, it has been studied that a semiconductor chip constituting the inverter is made of a wide bandgap semiconductor material having a bandgap larger than that of silicon (Si).

This is because the wide bandgap semiconductor material has a larger breakdown voltage than silicon due to a larger bandgap than silicon. This is because the breakdown voltage can be secured even if the thickness of the semiconductor chip (thickness of the drift layer) is reduced as compared with a case where silicon is used. That is, when the semiconductor chip is made of the wide bandgap semiconductor material, the thickness of the semiconductor chip can be reduced as compared with the case where the semiconductor chip is made of silicon, so that the on-resistance can be reduced.

Therefore, when the semiconductor chip is made of the wide bandgap semiconductor material, it is possible to reduce the on-resistance while ensuring the breakdown voltage, so that the loss of the inverter can be reduced. However, since the wide bandgap semiconductor material has a high breakdown voltage, for example, when an accelerated test for applying a high voltage to the semiconductor chip is performed, high electric field concentration may occur at the outer peripheral portion of the semiconductor chip, and aerial discharge may occur. For this reason, in order to perform an accelerated test for applying a high voltage to a semiconductor chip made of a wide bandgap semiconductor material, a device for suppressing the occurrence of aerial discharge is desired.

In this regard, it has been studied to perform an accelerated test for applying a high voltage to a semiconductor chip in a state where an outer peripheral portion of the semiconductor chip is covered with a resin. For example, as a method for covering the outer peripheral portion of the semiconductor chip with a thick resin, a method for applying a resin to the outer peripheral portion of the semiconductor chip using a dispenser is considered. However, in this method, since the resin spreads over a front electrode formed on a front surface of the semiconductor chip, the opening of the front electrode becomes small. The fact that the area of the opening of the front electrode becomes small means that the heat dissipation efficiency from the front electrode is reduced, so that the area of the opening of the front electrode is desirably as large as possible.

Therefore, it is conceivable to perform an accelerated test in which a high voltage is applied not in the state of the semiconductor chip but in the state of a module in which the semiconductor chip is sealed with resin (state of package). However, when an accelerated test in which a high voltage is applied is performed in the state of the module, and the semiconductor chip is determined to be defective in the accelerated test, the entire module in which the semiconductor chip determined to be defective is sealed cannot be used and is wasted. That is, when the accelerated test in which a high voltage is applied in the state of the module is performed, the manufacturing yield of the module decreases, which leads to an increase in the manufacturing cost of a semiconductor device.

Therefore, it is desired to devise a technique that makes it possible to perform an accelerated test in which a resin is formed on the outer peripheral portion and a high voltage is applied in a state other than the singulated semiconductor chip and the module instead of performing the accelerated test in a state of the singulated semiconductor chip and the module in which the semiconductor chip is sealed.

Other problems and novel features will become apparent from the description of the present specification and the accompanying drawings.

Solution to Problem

A method for manufacturing a semiconductor device according to an embodiment includes a step of performing an accelerated test including a dynamic test on each of a plurality of chip regions in the state of a semiconductor wafer containing, as a main component, a wide gap semiconductor material having a bandgap larger than that of silicon, and having the plurality of chip regions.

In addition, a method for manufacturing a semiconductor device according to an embodiment includes a step of performing an accelerated test including a dynamic test on each of a plurality of semiconductor chips in a state in which the plurality of semiconductor chips containing, as a main component, a wide gap semiconductor material having a bandgap larger than that of silicon are integrated.

A semiconductor device according to an embodiment includes a semiconductor chip containing, as a main component, a wide gap semiconductor material having a bandgap larger than that of silicon. Here, the semiconductor chip includes a semiconductor substrate, a semiconductor element formed on the semiconductor substrate, a front electrode formed on a front surface of the semiconductor substrate, a back electrode formed on a back surface of the semiconductor substrate, and a stepped portion formed between the front surface and a side surface of the semiconductor substrate. The semiconductor device further includes a sealing material covering a difference portion and a first conductor bonded to the front electrode.

Advantageous Effects of Invention

According to one embodiment, it is possible to perform an accelerated test for applying a high voltage without reducing the manufacturing yield of a semiconductor device using a wide gap semiconductor material.

BRIEF DESCRIPTION OF DRAWINGS

FIG. 1 is a flowchart illustrating a flow of a process of inspecting a semiconductor device in which a power semiconductor element is formed in a semiconductor chip containing silicon as a main component.

FIG. 2 is a flowchart illustrating a flow of a process of inspecting a semiconductor device in which a power semiconductor element is formed in a semiconductor chip containing a wide bandgap semiconductor material as a main component.

DESCRIPTION OF EMBODIMENTS

Figure 3:
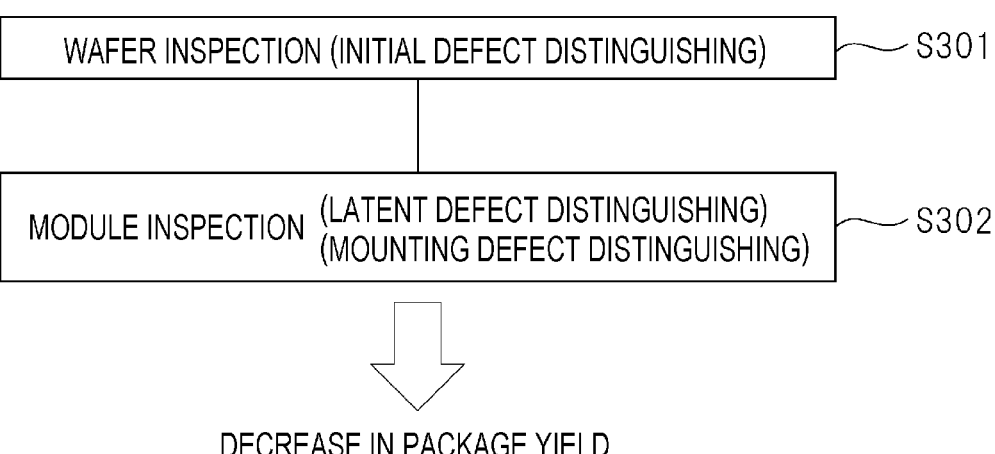
FIG. 3 is a flowchart illustrating a flow of an inspection process of performing an accelerated test in the state of a module.

In all the drawings for describing the embodiments, the same members are denoted by the same reference numerals in principle, and repeated description thereof will be omitted. Note that hatching may be applied even in a plan view for easy understanding of the drawings.

First Embodiment

<Consideration of Improvement>

In a process of manufacturing a semiconductor device, in order to improve the reliability of the semiconductor device to be a product, an inspection process of distinguishing a non-defective product and a defective product is performed in various stages of the process of manufacturing the semiconductor device. This inspection process is roughly divided into an inspection process in the state of a semiconductor wafer, an inspection process in the state of a singulated semiconductor chip, and an inspection process in a state where the semiconductor chip is modularized. As a specific example, FIG. 1 is a flowchart illustrating a flow of a process of inspecting a semiconductor device in which a power semiconductor element represented by an IGBT is formed in a semiconductor chip containing silicon as a main component. In FIG. 1, first, wafer inspection is performed in the state of a semiconductor wafer having a plurality of chip regions (S101). In this wafer inspection, an initial defect in power semiconductor elements formed in the plurality of chip regions is distinguished. Next, after the plurality of chip regions included in the semiconductor wafer are singulated to obtain semiconductor chips, chip inspection is performed in the state of the semiconductor chips (S102). In the chip inspection, an accelerated test including a dynamic test for applying a high voltage close to a withstand voltage to an electrode of each semiconductor chip to inspect a flowing switching current is performed. As a result, a defect potentially present in the semiconductor chip can be revealed and the latent defect can be distinguished. In the following description, when the accelerated test is simply referred to as an accelerated test, the accelerated test is intended to include a dynamic test in which a high voltage close to a withstand voltage is applied to an electrode of a semiconductor chip to inspect a flowing switching current. Subsequently, after the semiconductor chips are modularized (packaged), module inspection is performed in the state of the module (S103). In this module inspection, a bonding defect of a semiconductor chip, a bonding defect of a wire, a void occurrence defect of resin, a defect of a resin insulating layer, and the like are inspected. In this way, by performing the inspection process during the process of manufacturing the semiconductor device, the reliability of the semiconductor device to be a product can be improved.

However, the flow of the inspection process illustrated in FIG. 1 cannot be applied to the process of inspecting a semiconductor device in which a power semiconductor element is formed in a semiconductor chip containing, as a main component, a wide bandgap semiconductor material having a bandgap larger than that of silicon. That is, FIG. 2 is a flowchart illustrating a flow of a process of inspecting a semiconductor device in which a power semiconductor element is formed in a semiconductor chip containing a wide bandgap semiconductor material as a main component. Also in FIG. 2, after the wafer inspection is performed (S201), the chip inspection is performed (S202), and thereafter, the module inspection is to be performed (S203), but it is difficult to perform the chip inspection.

The reason for this will be described below.

The wide bandgap semiconductor material has a larger bandgap than silicon. In addition, since a large bandgap means a large breakdown voltage, the wide bandgap semiconductor material has a breakdown voltage higher than that of silicon.

Here, in an accelerated test in which a high voltage is applied to a semiconductor chip containing a wide bandgap semiconductor material as a main component to inspect a flowing switching current, a high voltage is applied in accordance with the breakdown voltage of the wide bandgap semiconductor material. As a result, in the corner portion (end portion) of the semiconductor chip, there is an increased possibility that electric field concentration occurs and aerial discharge occurs. When the aerial discharge occurs, the accelerated test cannot be performed.

For the above reason, the accelerated test cannot be performed on the semiconductor chip containing the wide bandgap semiconductor material as a main component in the state of the semiconductor chip.

Therefore, it is conceivable to perform the accelerated test in the state of the module in which the end portion of the semiconductor chip is covered with the resin, not in the state of the semiconductor chip in which the end is exposed to the air. This is because the semiconductor chip is covered with the resin (sealing material) in the state of the module, so that the accelerated test can be performed without the occurrence of aerial discharge.

FIG. 3 is a flowchart illustrating a flow of an inspection process of performing the accelerated test in the state of a module. As illustrated in FIG. 3, after wafer inspection is performed in the state of a semiconductor wafer (S301), accelerated inspection is also performed in the state of the module (S302), whereby latent defect distinguishing and mounting defect distinguishing are performed in module inspection. However, in a case where the accelerated test is performed in the state of the module, for example, a plurality of semiconductor chips are sealed in the module of power semiconductor elements, and thus, when even one of these semiconductor chips is determined to be defective in the accelerated test, the other non-defective semiconductor chips are wasted. Furthermore, module components constituting the module are also wasted. That is, when the accelerated test is performed in the state of the module, the manufacturing yield of the module decreases, and as a result, the manufacturing cost of the semiconductor device increases.

Therefore, it is desired to perform the accelerated test in a state other than the semiconductor chips and the module instead of performing the accelerated test in the state of the semiconductor chips or the module, and in the present embodiment, it is devised to perform the accelerated test in a state other than the semiconductor chips and the module. Hereinafter, the basic idea in this devised embodiment will be described.

Basic Idea in First Embodiment

Figure 4:
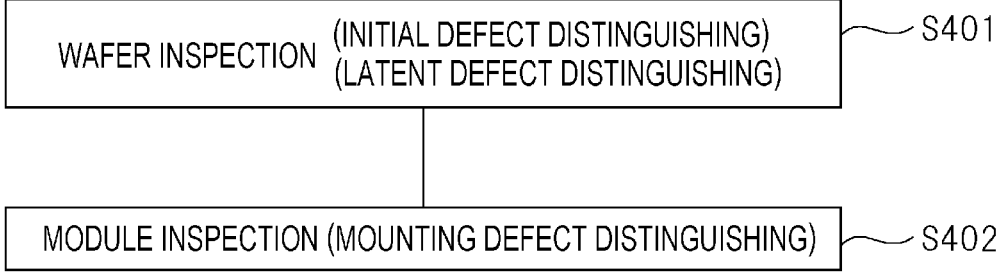
FIG. 4 is a flowchart illustrating a flow of an inspection process of performing an accelerated test in the state of a semiconductor wafer.

FIG. 4 is a flowchart illustrating a flow of an inspection process of performing an accelerated test in the state of a semiconductor wafer. As illustrated in FIG. 4, wafer inspection is performed in the state of the semiconductor wafer. In the wafer inspection, an initial defect is distinguished, and a latent defect is distinguished by performing the accelerated test (S401). Thereafter, module inspection is performed in the state of a module (S402). In this module inspection, a mounting defect is distinguished.

The technical idea in the first embodiment is, for example, an idea of performing the accelerated test in the state of a semiconductor wafer to distinguish a latent defect as illustrated in FIG. 4. That is, the basic idea in the first embodiment is the technical idea to perform the accelerated test on a semiconductor chip containing a wide bandgap semiconductor material as a main component not in the state of a semiconductor chip but in the state of the semiconductor wafer. According to this basic idea, the accelerated test can also be performed on a semiconductor chip containing, as a main component, a wide bandgap semiconductor material that cannot be subjected to the accelerated test in the state of a semiconductor chip. Furthermore, according to this basic idea, it is not necessary to perform the accelerated test in the state of a module, and thus, it is possible to suppress a decrease in the manufacturing yield of the module. As described above, the basic idea in the first embodiment in which the accelerated test is performed in the state of a semiconductor wafer can be said to be a very excellent idea in providing a technical idea of performing the accelerated test on a semiconductor chip containing a wide bandgap semiconductor material as a main component in a state other than the semiconductor chip and the module.

Hereinafter, an example of a specific aspect embodying the above-described basic idea will be described.

<Configuration in which Semiconductor Device is Mounted>

Figure 5:
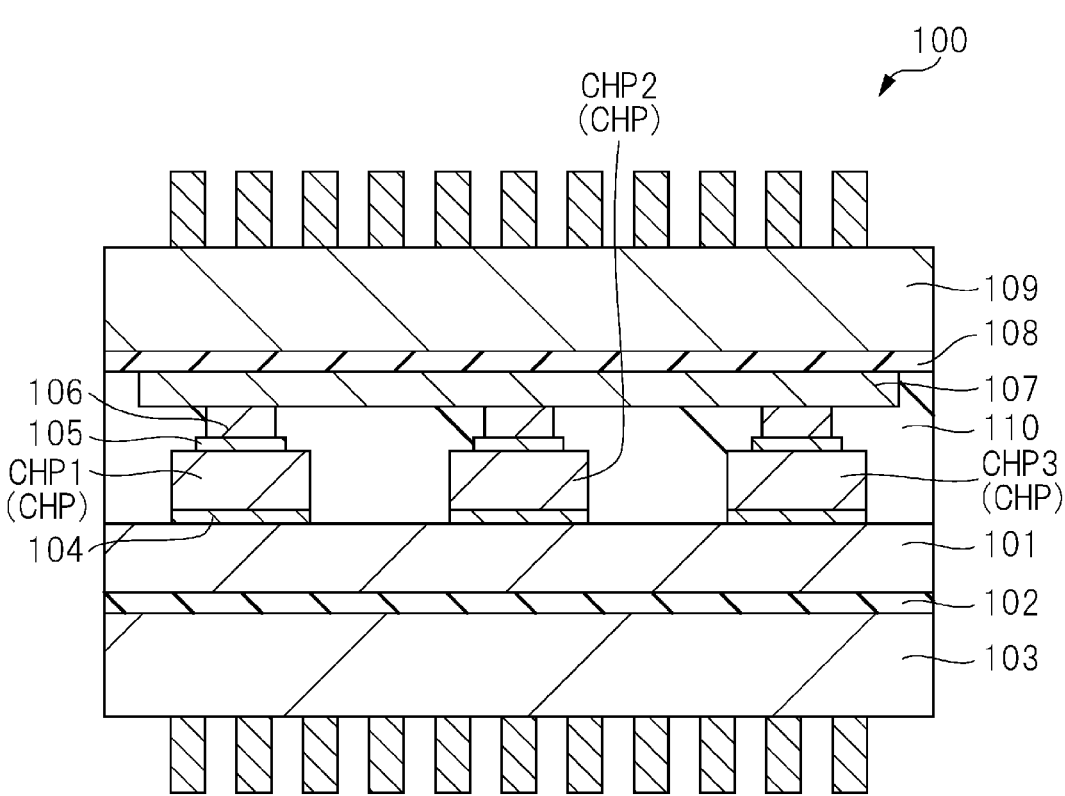
FIG. 5 is a cross-sectional view illustrating an example of a configuration in which a power semiconductor device is mounted.

FIG. 5 is a cross-sectional view illustrating an example of a configuration in which a power semiconductor device is mounted.

In FIG. 5, a power semiconductor device 100 includes, for example, a plurality of semiconductor chips CHP mounted on a front surface of a chip mounting portion 101 made of a copper material. In particular, in FIG. 5, the semiconductor chip CHP1, the semiconductor chip CHP2, and the semiconductor chip CHP3 are mounted on the chip mounting portion 101. On the other hand, a metal fin 103 is provided on a back surface of the chip mounting portion 101 via a resin insulating layer 102. The metal fin 103 is formed of, for example, aluminum, and has a function of dissipating heat generated in the plurality of semiconductor chips CHP to the external environment. In addition, the resin insulating layer 102 has a function of electrically insulating the chip mounting portion 101 and the metal fin 103.

Next, in FIG. 5, each of the plurality of semiconductor chips CHP has a back electrode 104 formed on the back surface and a front electrode 105 formed on the front surface. In the semiconductor chip CHP, for example, a power semiconductor element that controls on/off of a current flowing between the back electrode 104 and the front electrode 105 is formed. In FIG. 5, a diode is assumed as an example of the power semiconductor element, but the power semiconductor element is not limited to the diode, and may be a power metal oxide semiconductor field effect transistor (MOSFET) or an insulated gate bipolar transistor (IGBT).

Each of the plurality of semiconductor chips CHP is made of a wide bandgap semiconductor material as a main component. Here, the "main component" refers to a component contained in the largest amount, and is used with the intention of allowing impurities and other components to be contained. The wide bandgap semiconductor material refers to a semiconductor material having a bandgap larger than that of silicon, and examples thereof include silicon carbide (SiC), gallium nitride (GaN), gallium oxide (Ga₂O₃), and diamond.

Subsequently, a conductor 106 is provided on each of the front electrodes 105 of the plurality of semiconductor chips CHP. The conductors 106 have a function of electrically connecting the front electrodes 105 and an external terminal, and can be formed of, for example, copper, a composite material of copper and carbon, a composite material of aluminum and carbon, or the like.

Then, for example, as illustrated in FIG. 5, the conductor 106 provided on the semiconductor chip CHP1, the conductor 106 provided on the semiconductor chip CHP2, and the conductor 106 provided on the semiconductor chip CHP3 are connected by a conductor plate 107.

Further, a metal fin 109 is provided on the conductor plate 107 via a resin insulating layer 108. The metal fin 109 is formed of, for example, aluminum, and has a function of dissipating heat generated in the plurality of semiconductor chips CHP to the external environment. In addition, the resin insulating layer 108 has a function of electrically insulating the conductor plate 107 and the metal fin 103.

Subsequently, as illustrated in FIG. 5, the plurality of semiconductor chips CHP are covered with a sealing material 110. The sealing material 110 can be formed of, for example, a mold resin, but is not limited thereto, and may be formed of a gel. When the sealing material 110 is formed of a resin, the glass transition temperature of the resin is desirably 175° C. or higher. This is because the present invention needs to be applied to a power semiconductor element having a high bonding temperature formed in a semiconductor chip.

In this manner, the power semiconductor device 100, which is a package structure obtained by modularizing the plurality of semiconductor chips CHP, is mounted.

<Method for Manufacturing Semiconductor Chip>

Hereinafter, a process of manufacturing the semiconductor chips CHP included in the power semiconductor device 100 will be described. In the process of manufacturing the semiconductor chips CHP, the inspection process including the accelerated test is performed in the state of a semiconductor wafer. That is, in the process of manufacturing the semiconductor chips CHP according to the first embodiment, in accordance with the above-described basic idea, there is provided a step of performing an accelerated test on each of a plurality of chip regions in the state of a semiconductor wafer containing, as a main component, a wide gap semiconductor material having a bandgap larger than that of silicon, and having the plurality of chip regions.

Figure 6:
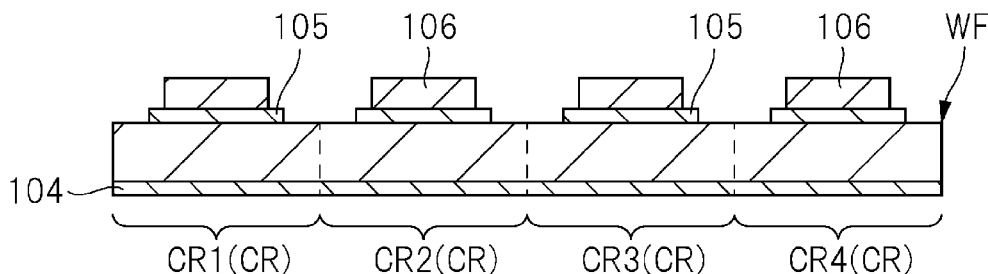
FIG. 6 is a cross-sectional view illustrating a process of manufacturing a semiconductor chip according to a first embodiment.

First, as illustrated in FIG. 6, a semiconductor wafer WF containing, as a main component, a wide bandgap semiconductor material having a bandgap larger than that of silicon, and having a plurality of chip regions CR is prepared. In the semiconductor wafer WF, for example, as illustrated in FIG. 6, chip regions CR1 to CR4 are formed, and diodes which are power semiconductor elements are formed in each of the chip region CR1 to the chip region CR4. Specifically, a drift layer is formed in each of the chip region CR1 to the chip region CR4, and a power semiconductor element is formed in the drift layer. The drift layer is formed to secure a withstand voltage of the power semiconductor element, and for example, the thickness of the drift layer is about 10 μm. The region where the power semiconductor element is formed is called an active region, and a scribe region is formed outside the active region. At this time, a boundary region of the plurality of chip regions CR is a scribe region.

The back electrodes 104 are formed on the back surface of the semiconductor wafer WF, while the front electrodes 105 are formed on the front surface of the semiconductor wafer WF for each of the plurality of chip regions CR. For the semiconductor wafer WF configured as described above, the conductor 106 is bonded onto the front electrode 105 formed for each of the plurality of chip regions CR. For example, the conductor 106 may be bonded to the front electrode 105 via a bonding layer represented by solder, sintered copper, or sintered silver. Alternatively, the front electrode 105 and the conductor 106 may be made of the same metal material and bonded by direct bonding. Furthermore, the conductor 106 can also be formed by plating via a seed material.

Figure 7:
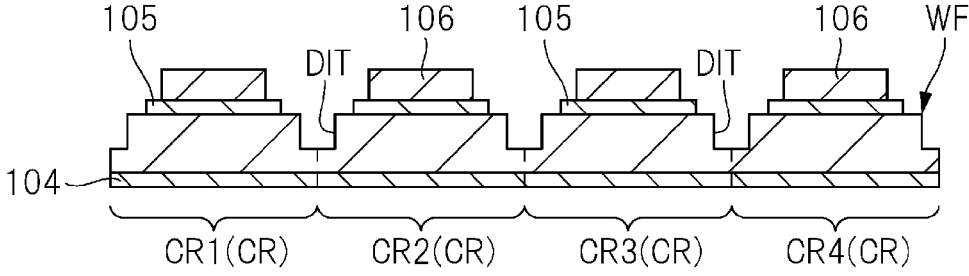
FIG. 7 is a cross-sectional view illustrating a process of manufacturing the semiconductor chip, which is subsequent to FIG. 6.

Next, as illustrated in FIG. 7, a groove DIT is formed in the boundary region (scribe region) that defines the plurality of chip regions CR. The groove DIT is formed to be smaller than the thickness of the semiconductor wafer WF so as not to divide the semiconductor wafer WF. On the other hand, for example, the depth of the groove DIT is deeper than the thickness of the drift layer. Specifically, when the thickness of the drift layer is 10 μm, the depth of the groove DIT is 12 μm. This groove DIT can be formed, for example, by half cutting with a dicing blade. However, the groove DIT is not limited to half cutting with a dicing blade, and can also be formed in advance using a photolithography technique and an etching technique in a process prior to a process (process illustrated in FIG. 6) of bonding the conductor 106 to the front electrode 105.

Figure 8:
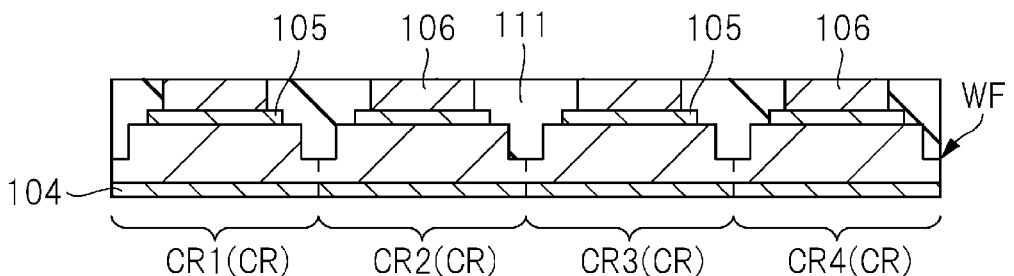
FIG. 8 is a cross-sectional view illustrating a process of manufacturing the semiconductor chip, which is subsequent to FIG. 7.

Subsequently, as illustrated in FIG. 8, the inside of the groove DIT and a gap between the conductors 106 adjacent to each other are filled with a sealing material 111. As a result, the end portion (corner portion) of each of the plurality of chip regions CR on the front surface side is covered with the sealing material 111. In this case, as the sealing material 111, for example, a resin having a glass transition temperature of 175° C. or higher can be used.

Thereafter, the accelerated test is performed in the state of the semiconductor wafer WF illustrated in FIG. 8. That is, the accelerated test is performed on each of the plurality of chip regions CR formed on the semiconductor wafer WF in a state where the inside of the groove DIT and the gap between the conductors 106 adjacent to each other are filled with the sealing material 111. In other words, the accelerated test is performed in a state where the end portion (corner portion) of each of the plurality of chip regions CR on the front surface side is covered with the sealing material 111.

Here, the accelerated test includes a switching test (dynamic test) in a state where a voltage higher than the operating voltage of the power semiconductor element is applied. Specifically, in this dynamic test, a switching current flowing through the power semiconductor element is inspected by applying a high voltage close to the breakdown voltage of the power semiconductor element between the back electrode 104 and the front electrode 105. As a result, a latent defect of the power semiconductor element is distinguished.

Figure 9:
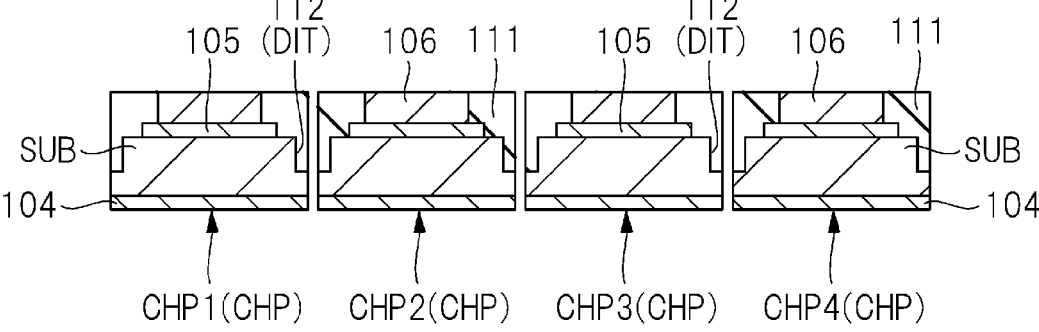
FIG. 9 is a cross-sectional view illustrating a process of manufacturing the semiconductor chip, which is subsequent to FIG. 8.

Next, as illustrated in FIG. 9, the plurality of chip regions CR are singulated so as to divide the gap filled with the sealing material 111 and the groove DIT filled with the sealing material 111. As a result, it is possible to acquire the semiconductor chip CHP which has a stepped portion 112 formed between the front surface and the side surface by dividing the groove DIT and in which the stepped portion 112 including an end portion (corner portion) is covered with the sealing material 111. Here, as a method for dividing the plurality of chip regions CR, for example, a full-cut method using a dicing blade having a narrower width than the dicing blade used for forming the groove DIT illustrated in FIG. 7, or an ultrasonic dicing method can be used.

As described above, the semiconductor chips CHP according to the first embodiment can be manufactured by singulating the plurality of chip regions CR finally present on the semiconductor wafer WF while performing the inspection process including the accelerated test in the state of the semiconductor wafer WF.

<Features in Manufacturing Method>

Next, feature points in the manufacturing method in the first embodiment will be described.

The first feature point in the manufacturing method in the first embodiment is that the accelerated test is performed in the state of the semiconductor wafer WF. More specifically, the first feature point in the manufacturing method in the first embodiment is that, for example, as illustrated in FIG. 8, the accelerated test of the power semiconductor element formed in each of the plurality of chip regions CR is performed in a state where the inside of the groove DIT formed in the boundary region between the chip regions CR adjacent to each other and the gap between the conductors 106 adjacent to each other are covered with the sealing material 111. In this case, since the end portion (corner portion) of each of the chip regions CR is covered with the sealing material 111, it is possible to suppress the occurrence of aerial discharge even when the accelerated test using a high voltage close to the breakdown voltage is performed. As a result, in the state of the semiconductor chip CHP, the accelerated test cannot be appropriately performed due to the aerial discharge generated at the end portion (corner portion) of the semiconductor chip CHP. However, in the first embodiment, the accelerated test can be performed in the state of the semiconductor wafer WF without the occurrence of aerial discharge by devising the formation of the groove DIT in the boundary region between the chip regions CR adjacent to each other and the filling of the inside of the groove DIT with the sealing material 111.

In particular, in the first embodiment, the end portions (corner portions) are intentionally developed in the chip regions CR by forming the groove DIT in the state of the semiconductor wafer WF, and the end portions (corner portions) are covered with the sealing material 111. This means that, according to the first embodiment, for example, in the product (power semiconductor device 100) illustrated in FIG. 5, a structure equivalent to the chip end structure in which the end portions (corner portions) of the semiconductor chips CHP are covered with the sealing material 110 is fabricated in the state of the semiconductor wafer WF in a pseudo manner. As a result, according to the first feature point in the manufacturing method in the first embodiment, the accelerated test can be performed under the same conditions as those for the chip end structure of the product in the state of the semiconductor wafer WF. This means that, according to the first embodiment, it is possible to obtain a highly reliable distinguishing result based on a product similar to the case where the accelerated test is performed on the power semiconductor device 100, which is a product, in the state of the semiconductor wafer WF during the process of manufacturing the semiconductor chips CHP. That is, according to the first embodiment, there is a great technical significance in that the accelerated test necessary and sufficient for securing the reliability of the product can be performed in the state of the semiconductor wafer WF. Furthermore, the fact that the chip end structure equivalent to that of the product (the power semiconductor device 100) is fabricated in the state of the semiconductor wafer WF means that not only the accelerated test conforming to the product (the power semiconductor device 100) can be performed as described above, but also the manufacturing yield of the product (module) can be improved.

For example, when the accelerated test is performed in the product state (module state) and it is determined that a semiconductor chip CHP is defective, other non-defective semiconductor chips CHP mounted on one product are wasted, and module components are also wasted. On the other hand, according to the first embodiment, a part determined to be defective in the accelerated test is not the product (module) but a part of the chip regions CR of the semiconductor wafer WF. Therefore, since it is sufficient that the chip region CR determined to be defective is not used in the subsequent process, the other semiconductor chips CHP and module components determined to be non-defective are not wasted. For this reason, according to the first embodiment, the manufacturing yield of the product (module) can be improved.

As described above, it can be seen that the first feature point in the manufacturing method in the first embodiment is an excellent technical idea in that not only the highly reliable accelerated test conforming to the product (module) can be performed in the state of the semiconductor wafer WF, but also the manufacturing yield of the product can be significantly improved.

More specifically, in the first embodiment, it is important that the accelerated test can be performed in the state of the semiconductor wafer WF. For example, when the first feature point in the manufacturing method in the first embodiment is adopted, it is considered that the accelerated test can be performed not only in the state of the semiconductor wafer WF illustrated in FIG. 8 but also in the state in which the semiconductor wafer WF illustrated in FIG. 9 is singulated into a plurality of semiconductor chips CHP. This is because also in the semiconductor chips CHP illustrated in FIG. 9, the upper end portions (corner portions) are covered with the sealing material 111. However, when the accelerated test is performed in the state of the semiconductor chips CHP, it is necessary to perform the accelerated test on each of the plurality of semiconductor chips CHP, which increases the cost and time required for the accelerated test. On the other hand, when the accelerated test is performed in the state of the semiconductor wafer WF illustrated in FIG. 8, the accelerated test can be performed in units of the semiconductor wafer WF. That is, since the accelerated test can be performed collectively on the plurality of chip regions CR formed on the semiconductor wafer WF, it is efficient, and the cost and time required for the accelerated test can be reduced. Therefore, also from this, it can be seen that the first feature point in the manufacturing method in the first embodiment in which the accelerated test is performed in the state of the semiconductor wafer WF is an excellent technical idea.

However, in a case where the accelerated test is performed in the state of the semiconductor wafer WF, for example, in a case where a power semiconductor element formed in a certain chip region CR is broken, there is a concern that a power semiconductor element formed in a chip region adjacent to the chip region CR is adversely affected. In this regard, in the first embodiment, even if the power semiconductor element formed in one chip region CR is broken in the accelerated test, an effect on the power semiconductor element formed in the chip region adjacent to the chip region CR is reduced. This devised point is a second feature in the manufacturing method in the first embodiment.

The second feature point in the manufacturing method in the first embodiment is that the inside of the groove DIT formed in the boundary region between the chip regions CR adjacent to each other is filled with the sealing material 111 that is an insulating material. As a result, the active regions formed in the chip regions CR adjacent to each other are electrically insulated by the sealing material 111 with which the inside of the groove DIT is filled. As a result, even if a power semiconductor element formed in a certain chip region CR is broken in the accelerated test, the active regions of the chip regions CR adjacent to each other are electrically insulated by the sealing material 111 embedded in the groove DIT, so that it is possible to reduce an adverse effect on a power semiconductor element formed in a chip region CR adjacent to the chip region CR in which the broken power semiconductor element is formed.

<Configuration of Semiconductor Chip>

Next, a configuration of a semiconductor chip manufactured by the method for manufacturing the semiconductor chip CHP according to the first embodiment described above will be described with reference to the drawings.

Figure 10:
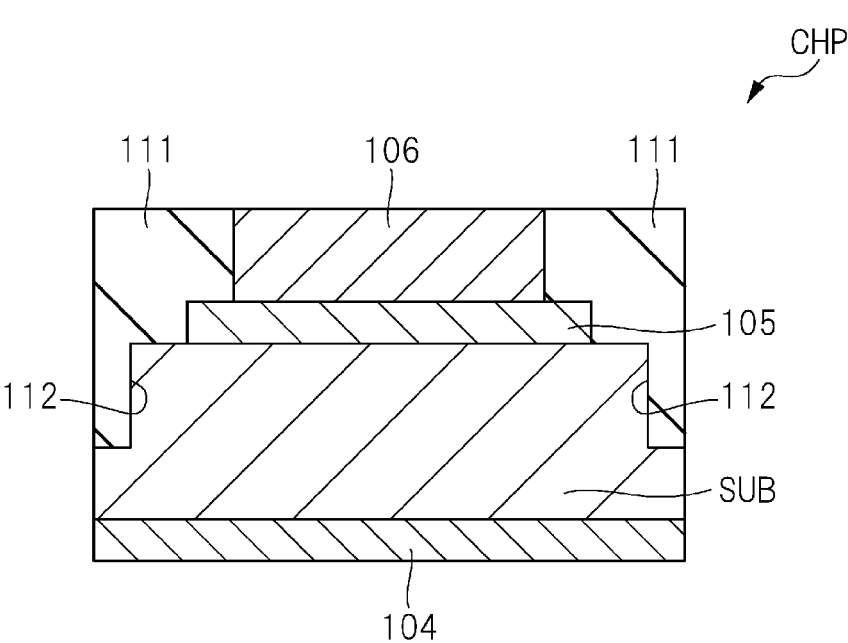
FIG. 10 is a cross-sectional view illustrating a schematic configuration of the semiconductor chip according to the first embodiment.

FIG. 10 is a cross-sectional view illustrating a schematic configuration of the semiconductor chip according to the first embodiment.

In FIG. 10, the semiconductor chip CHP according to the first embodiment includes a semiconductor substrate SUB. The back electrode 104 is formed on the back surface of the semiconductor substrate SUB, while the front electrode 105 is formed on the front surface of the semiconductor substrate SUB. The semiconductor substrate SUB contains, as a main component, for example, a wide bandgap semiconductor material having a larger bandgap than silicon, such as silicon carbide (SiC), gallium nitride (GaN), gallium oxide ($Ga_2O_3$), or diamond. A drift layer for securing a withstand voltage is formed on the semiconductor substrate SUB. In addition, the semiconductor substrate SUB includes an active region, and a power semiconductor element is formed in the active region. Further, as illustrated in FIG. 10, the semiconductor substrate SUB has a stepped portion 112 formed between the front surface and the side surface.

The semiconductor chip CHP according to the first embodiment includes, in addition to the semiconductor substrate SUB having the above-described configuration, the sealing material 111 covering the stepped portion 112, and the conductor 106 bonded to the front electrode 105. In this way, the semiconductor chip CHP is configured.

<Structural Features>

Next, structural features of the semiconductor chip CHP according to the first embodiment will be described. A structural feature in the first embodiment is that the step of the stepped portion 112 is larger than the thickness of the drift layer formed on the semiconductor substrate SUB. As a result, for example, the region corresponding to the thickness of the drift layer where a high electric field is generated can be covered with the sealing material 111 with which the stepped portion 112 is filled, so that the occurrence of aerial discharge caused by the electric field concentration can be suppressed. On the other hand, a step of the stepped portion 112 is smaller than the thickness of the semiconductor substrate SUB. As a result, for example, as illustrated in FIG. 10, the area (plane area) of the back surface of the semiconductor substrate SUB can be made larger than the area (plane area) of the front surface of the semiconductor substrate SUB. As a result, according to the structural feature point in the first embodiment, the occurrence of aerial discharge is suppressed by the sealing material 111 with which the stepped portion 112 is filled on the front surface side, and the area of the back surface can be secured by not forming the stepped portion 112 on the back surface side, so that the efficiency of dissipating heat generated in the power semiconductor element can be improved.

<Modification 1>

Next, Modification 1 of the method for manufacturing a semiconductor chip according to the first embodiment will be described.

Figure 11:
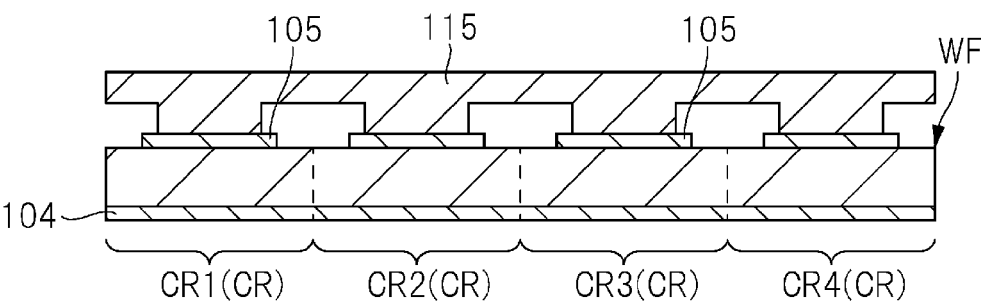
FIG. 11 is a cross-sectional view illustrating a process of manufacturing a semiconductor chip according to Modification 1.
Figure 12:
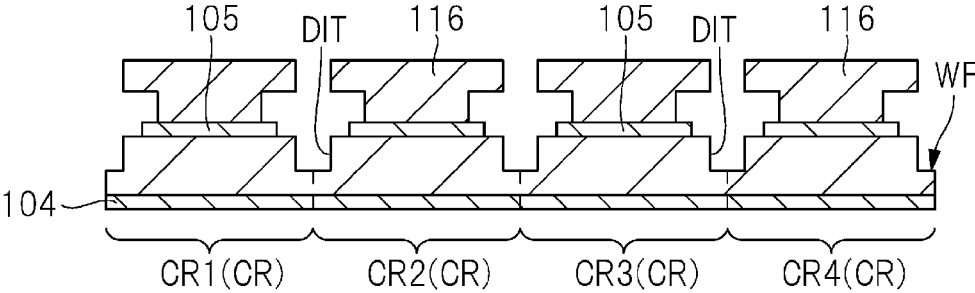
FIG. 12 is a cross-sectional view illustrating a process of manufacturing the semiconductor chip, which is subsequent to FIG. 11.
Figure 13:
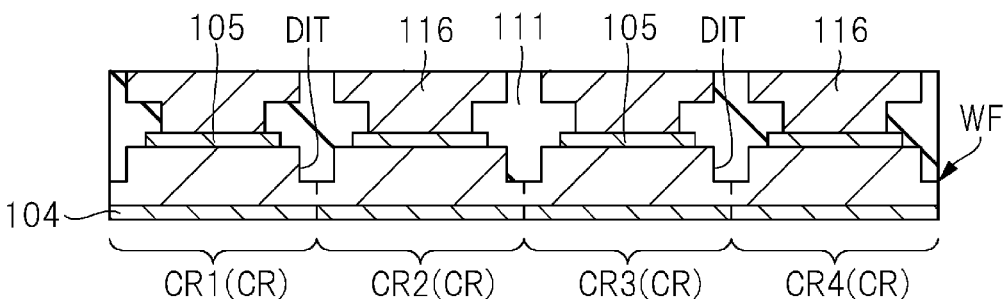
FIG. 13 is a cross-sectional view illustrating a process of manufacturing the semiconductor chip, which is subsequent to FIG. 12.
Figure 14:
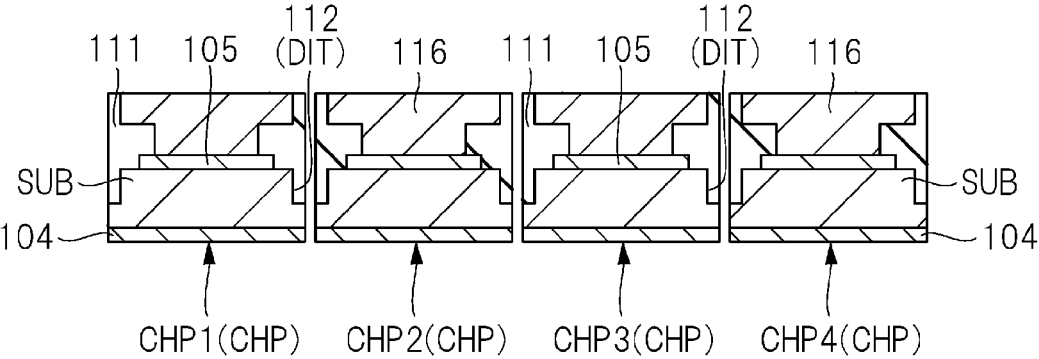
FIG. 14 is a cross-sectional view illustrating a process of manufacturing the semiconductor chip, which is subsequent to FIG. 13.

As illustrated in FIG. 11, for a semiconductor wafer WF on which back electrodes 104 and front electrodes 105 are formed, an integrated conductor 115 formed of an integrated component is bonded over the front electrodes 105 formed for each of a plurality of chip regions CR. Thereafter, as illustrated in FIG. 12, the integrated conductor 115 is divided into a plurality of divided conductors 116 along a boundary region that defines a plurality of chip regions CR, and a groove DIT is formed in the boundary region. Then, as illustrated in FIG. 13, after the inside of the groove DIT and a gap between the divided conductors 116 adjacent to each other are filled with a sealing material 111, an accelerated test is performed on power semiconductor elements formed in the plurality of chip regions CR. Next, as illustrated in FIG. 14, the plurality of chip regions CR are singulated so as to divide the gap filled with the sealing material 111 and the groove DIT filled with the sealing material 111. As a result, a plurality of semiconductor chips CHP can be obtained from the semiconductor wafer WF.

According to Modification 1, as illustrated in FIG. 11, the integrated conductor 115 formed of the integrated component is bonded over the front electrodes 105 formed for each of the plurality of chip regions CR. This facilitates alignment between the front electrodes 105 and the integrated conductor 115. As a result, according to Modification 1, it is possible to increase a bonding area between the front electrodes 105 and the divided conductors 116, thereby obtaining an advantage that the thermal resistance of the semiconductor chips CHP can be reduced.

<Modification 2>

Next, Modification 2 of the method for manufacturing a semiconductor chip according to the first embodiment will be described.

Figure 15:
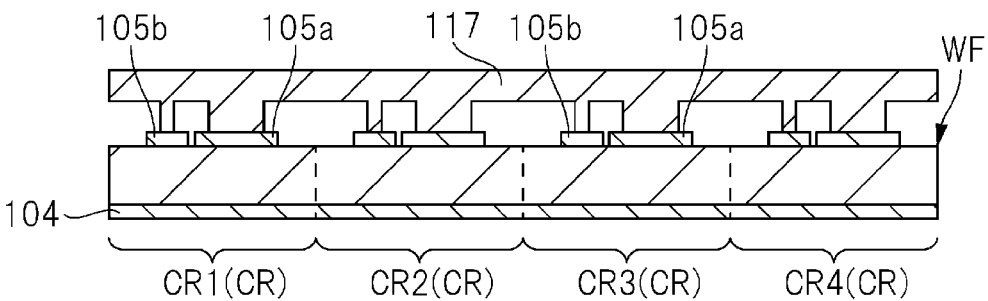
FIG. 15 is a cross-sectional view illustrating a process of manufacturing a semiconductor chip according to Modification 2.

In Modification 2, as illustrated in FIG. 15, an example in which a power semiconductor element formed in each of a plurality of chip regions CR is not a two-terminal diode but a three-terminal power MOSFET or a three-terminal IGBT will be described. Here, in Modification 2, for example, a back electrode 104, a front electrode 105*a*, and a control electrode (gate electrode) 105*b* are formed in each of the plurality of chip regions CR.

Figure 16:
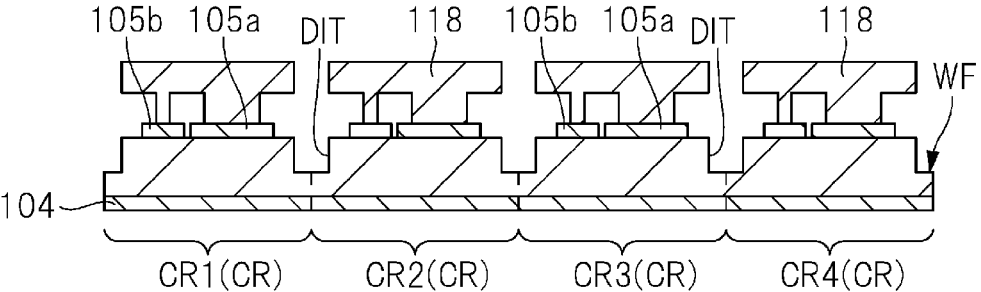
FIG. 16 is a cross-sectional view illustrating a process of manufacturing the semiconductor chip, which is subsequent to FIG. 15.
Figure 17:
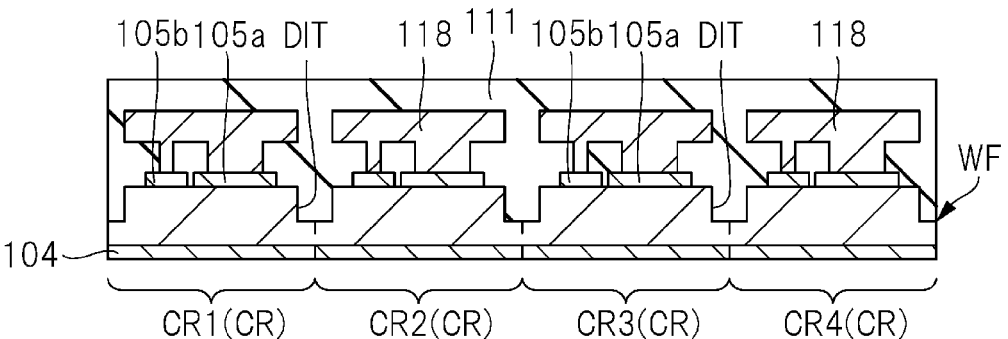
FIG. 17 is a cross-sectional view illustrating a process of manufacturing the semiconductor chip, which is subsequent to FIG. 16.
Figure 18:
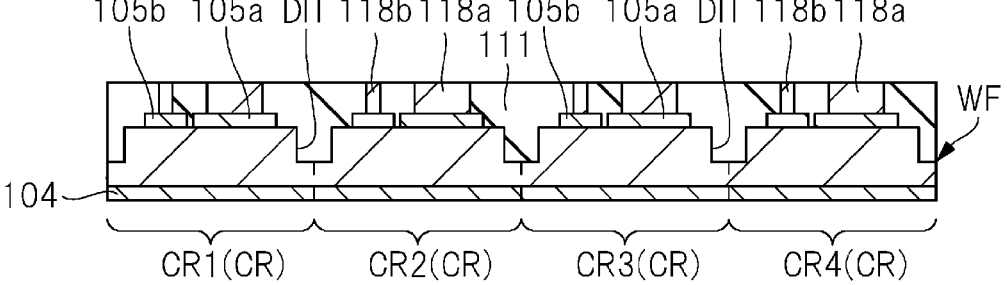
FIG. 18 is a cross-sectional view illustrating a process of manufacturing the semiconductor chip, which is subsequent to FIG. 17.

As illustrated in FIG. 15, for a semiconductor wafer WF on which the back electrodes 104, the front electrodes 105*a*, and the control electrodes 105*b* are formed, an integrated conductor 117 formed of an integrated component is bonded over the front electrodes 105*a* and the control electrodes 105*b* formed for each of the plurality of chip regions CR. Thereafter, as illustrated in FIG. 16, the integrated conductor 117 is divided into a plurality of divided conductors 118 along a boundary region that defines the plurality of chip regions CR, and a groove DIT is formed in the boundary region. Then, as illustrated in FIG. 17, the inside of the groove DIT and a gap between the divided conductors 118 adjacent to each other are filled with a sealing material 111, and the sealing material 111 is formed so as to cover the plurality of divided conductors 118. Next, as illustrated in FIG. 18, after the sealing material 111 covering the divided conductors 118 is polished to expose front surfaces of the divided conductors 118, parts of the divided conductors 118 whose front surfaces are exposed are also polished. As a result, each of the divided conductors 118 is further separated into a divided conductor 118*a* and a divided conductor 118*b*. Therefore, the divided conductor 118*a* bonded to the front electrode 105*a* and the divided conductor 118*b* bonded to the control electrode 105*b* are electrically and physically separated.

Figure 19:
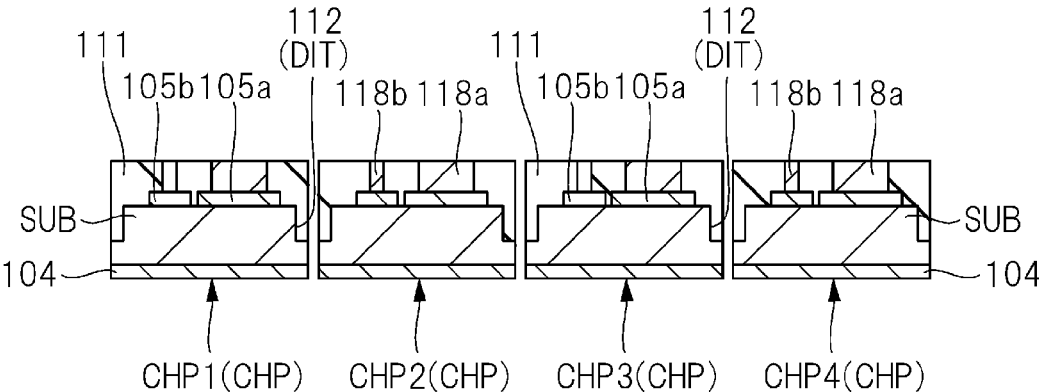
FIG. 19 is a cross-sectional view illustrating a process of manufacturing the semiconductor chip, which is subsequent to FIG. 18.

Thereafter, an accelerated test is performed on power semiconductor elements formed in each of the plurality of chip regions CR. Subsequently, as illustrated in FIG. 19, the plurality of chip regions CR are singulated so as to divide the gap filled with the sealing material 111 and the groove DIT filled with the sealing material 111. As a result, a plurality of semiconductor chips CHP can be obtained from the semiconductor wafer WF.

According to Modification 2, even when the power semiconductor elements formed in the plurality of chip regions CR are not only two-terminal diodes but also three-terminal power MOSFETs and three-terminal IGBTs, the integrated conductor 117 formed of the integrated component is bonded over the front electrodes 105*a* and the control electrodes 105*b* formed for each of the plurality of chip regions CR. This facilitates alignment of the front electrodes 105*a* with the integrated conductor 117 and alignment of the control electrodes 105*b* with the integrated conductor 117. In particular, since the size of each of the control electrodes 105*b* is small, the technical idea of the Modification 2 in which the integrated conductor 117 is used for bonding the control electrodes 105*b* and the divided conductors 118*b* is useful from the viewpoint of accurately bonding the control electrodes 105*b* and the divided conductors 118*b*.

<Modification 3>

Next, Modification 3 of the method for manufacturing a semiconductor chip according to the first embodiment will be described.

Figure 20:
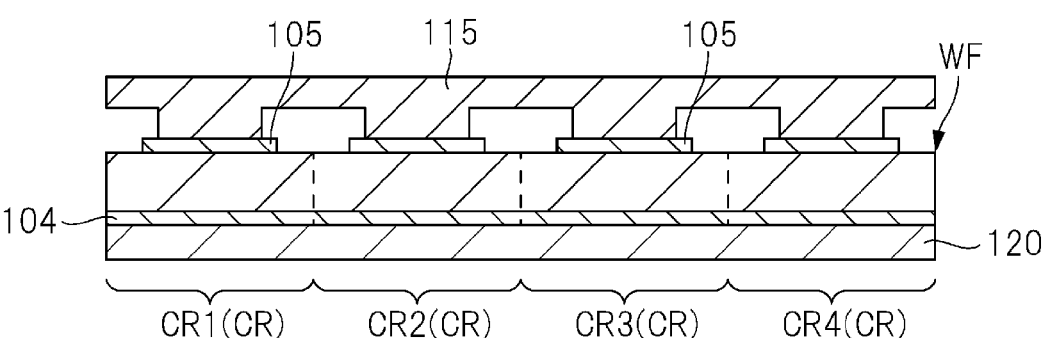
FIG. 20 is a cross-sectional view illustrating a process of manufacturing a semiconductor chip according to Modification 3.
Figure 21:
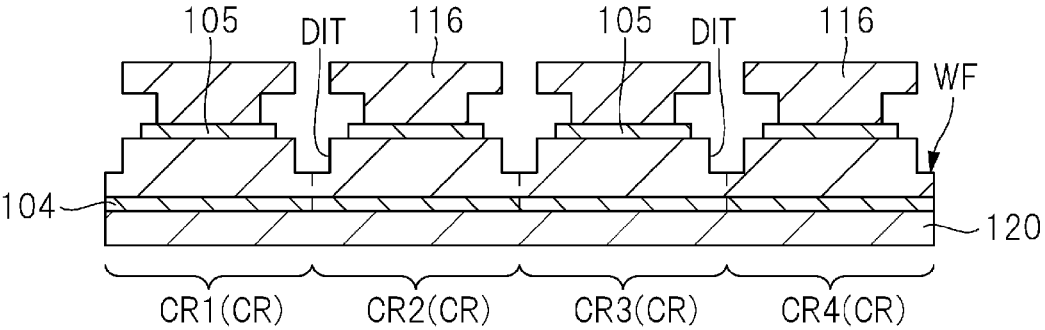
FIG. 21 is a cross-sectional view illustrating a process of manufacturing the semiconductor chip, which is subsequent to FIG. 20.
Figure 22:
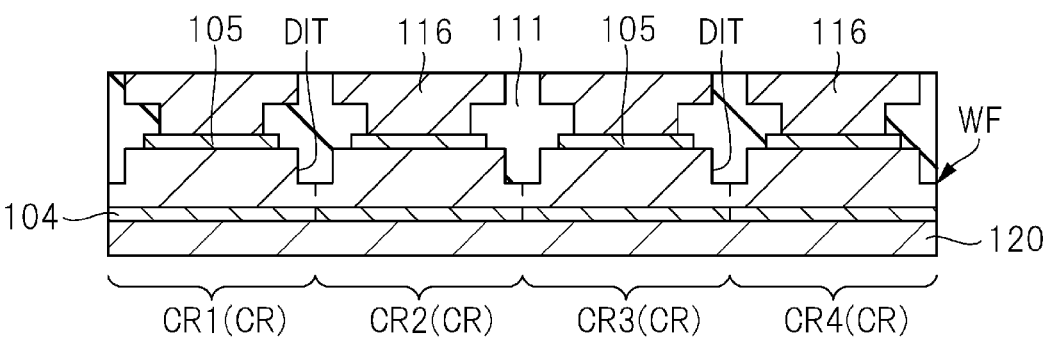
FIG. 22 is a cross-sectional view illustrating a process of manufacturing the semiconductor chip, which is subsequent to FIG. 21.
Figure 23:
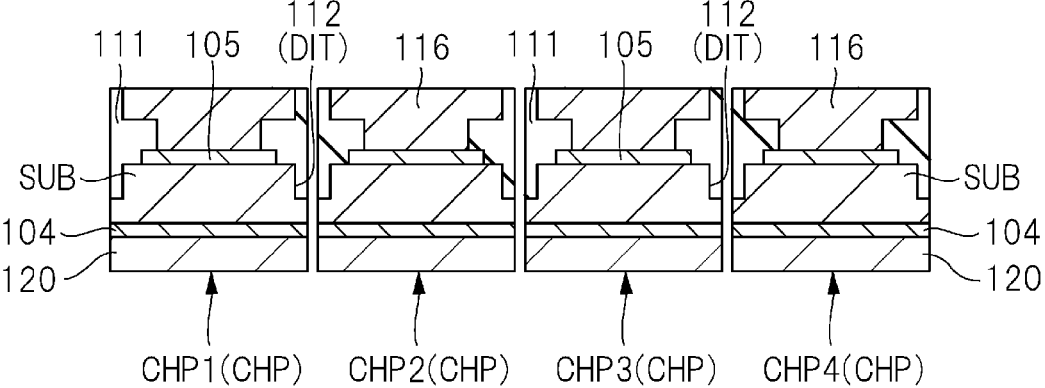
FIG. 23 is a cross-sectional view illustrating a process of manufacturing the semiconductor chip, which is subsequent to FIG. 22.

As illustrated in FIG. 20, for a semiconductor wafer WF on which back electrodes 104 and front electrodes 105 are formed, an integrated conductor 115 formed of an integrated component is bonded over the front electrodes 105 formed for each of a plurality of chip regions CR. On the other hand, a conductor 120 is bonded to the back electrodes 104 formed on the back surface of the semiconductor wafer WF. Thereafter, as illustrated in FIG. 21, the integrated conductor 115 is divided into a plurality of divided conductors 116 along a boundary region that defines the plurality of chip regions CR, and a groove DIT is formed in the boundary region. Then, as illustrated in FIG. 22, after the inside of the groove DIT and a gap between the divided conductors 116 adjacent to each other are filled with a sealing material 111, an accelerated test is performed on power semiconductor elements formed in each of the plurality of chip regions CR. Next, as illustrated in FIG. 23, the plurality of chip regions CR are singulated so as to divide the gap filled with the sealing material 111 and the groove DIT filled with the sealing material 111. As a result, a plurality of semiconductor chips CHP can be obtained from the semiconductor wafer WF.

According to Modification 3, as illustrated in FIG. 20, the integrated conductor 115 formed of the integrated component is bonded over the front electrodes 105 formed for each of the plurality of chip regions CR, and the conductor 120 is bonded to the back electrodes 104. As a result, warpage of the semiconductor wafer WF can be suppressed. That is, when the integrated conductor 115 is formed only on the front surface side of the semiconductor wafer WF, the semiconductor wafer WF may be warped due to the difference between coefficients of linear expansion caused by the difference between the material of the semiconductor wafer WF and the material of the integrated conductor 115. In this regard, in Modification 3, for example, as illustrated in FIG. 20, the conductor 120 is also bonded on the back surface side of the semiconductor wafer WF, so that it is possible to obtain an advantage that warpage of the semiconductor wafer WF can be suppressed.

In particular, from the viewpoint of suppressing the warpage of the semiconductor wafer WF, the thickness of the conductor 120 formed on the back surface side of the semiconductor wafer WF is desirably smaller than the thickness of the integrated conductor 115 bonded on the front surface side of the semiconductor wafer WF. This is because the bonding area of the conductor 120 bonded on the back surface side of the semiconductor wafer WF is larger than the bonding area of the integrated conductor 115 bonded on the front surface side of the semiconductor wafer WF. Therefore, in order to substantially offset the magnitude of the stress on the front surface side of the semiconductor wafer WF and the stress on the back surface side of the semiconductor wafer WF, the thickness of the conductor 120 needs to be smaller than the thickness of the integrated conductor 115.

<Modification 4>

Next, Modification 4 of the method for manufacturing a semiconductor chip according to the first embodiment will be described.

Figure 24:
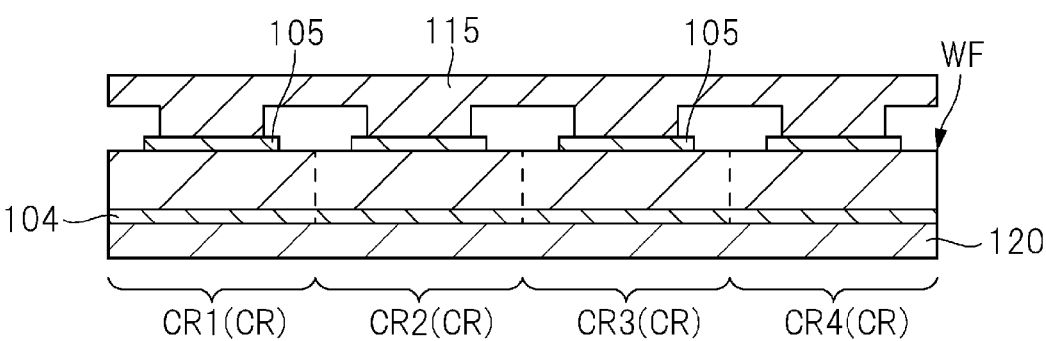
FIG. 24 is a cross-sectional view illustrating a process of manufacturing a semiconductor chip according to Modification 4.
Figure 25:
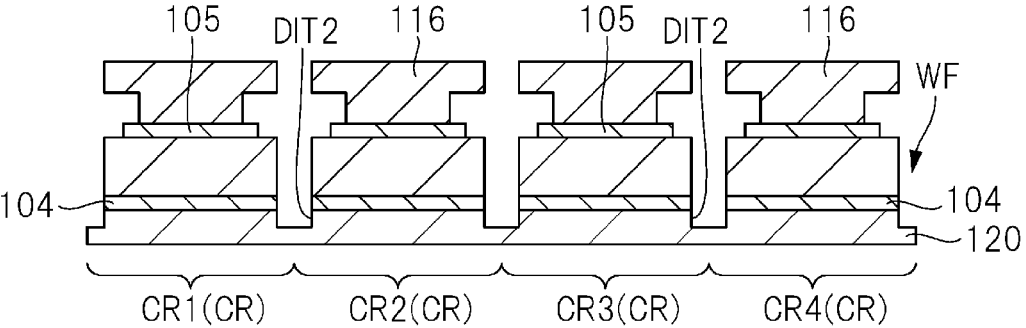
FIG. 25 is a cross-sectional view illustrating a process of manufacturing the semiconductor chip, which is subsequent to FIG. 24.
Figure 26:
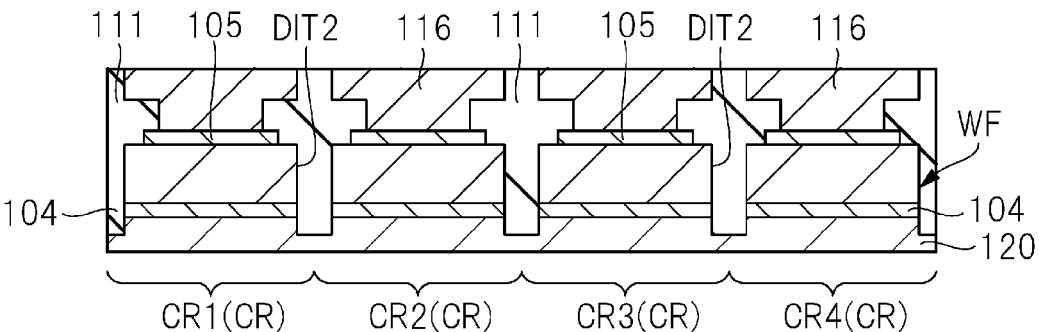
FIG. 26 is a cross-sectional view illustrating a process of manufacturing the semiconductor chip, which is subsequent to FIG. 25.
Figure 27:
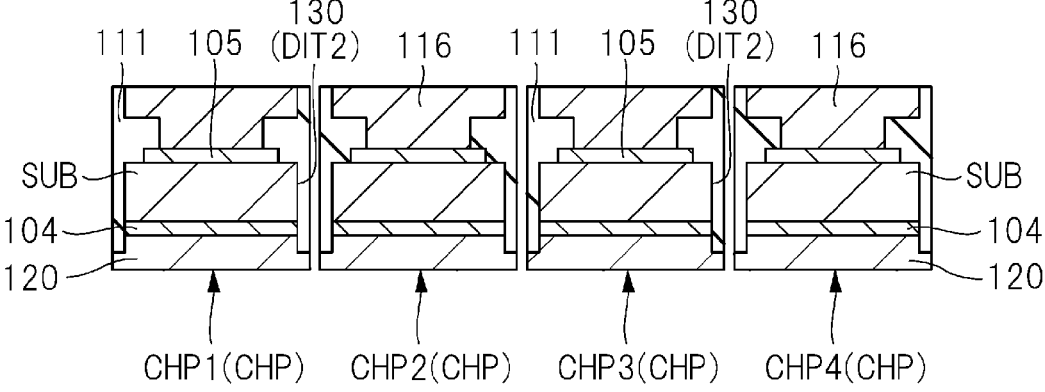
FIG. 27 is a cross-sectional view illustrating a process of manufacturing the semiconductor chip, which is subsequent to FIG. 26.

As illustrated in FIG. 24, for a semiconductor wafer WF on which back electrodes 104 and front electrodes 105 are formed, an integrated conductor 115 formed of an integrated component is bonded over the front electrodes 105 formed for each of a plurality of chip regions CR. On the other hand, a conductor 120 is bonded to the back electrodes 104 formed on the back surface of the semiconductor wafer WF. Thereafter, as illustrated in FIG. 25, the integrated conductor 115 is divided into a plurality of divided conductors 116 along a boundary region that defines the plurality of chip regions CR, and a groove DIT2 that penetrates the boundary region and reaches the conductor 120 is formed. Then, as illustrated in FIG. 26, after the inside of the groove DIT2 and a gap between the divided conductors 116 adjacent to each other are filled with a sealing material 111, an accelerated test is performed on power semiconductor elements formed in each of the plurality of chip regions CR. Next, as illustrated in FIG. 27, the plurality of chip regions CR are singulated so as to divide the gap filled with the sealing material 111 and the groove DIT2 filled with the sealing material 111. As a result, a plurality of semiconductor chips CHP can be obtained from the semiconductor wafer WF.

<<Configuration of Semiconductor Chip According to Modification 4>>

Each of the semiconductor chips CHP thus formed has the following configuration. The semiconductor chip CHP according to Modification 4 includes a semiconductor substrate SUB, a semiconductor element formed on the semiconductor substrate SUB, a front electrode 105 formed on a front surface of the semiconductor substrate SUB, and a back electrode 104 formed on a back surface of the semiconductor substrate SUB. The semiconductor chip CHP further includes a sealing material 111 covering an upper corner portion and a side surface of the semiconductor substrate SUB, a divided conductor 116 bonded to the front electrode, and a conductor 120 bonded to the back electrode 104. Here, the conductor 120 has a stepped portion 130 formed between the bonding surface between the conductor 120 and the back electrode 104 and the side surface of the conductor 120, and the stepped portion 130 is also filled with the sealing material 111.

<<Advantages of Modification 4>>

According to the semiconductor chip CHP according to Modification 4, for example, as illustrated in FIG. 27, the entire side surface of the semiconductor substrate SUB is covered with the sealing material 111. As a result, it is possible to suppress the intrusion of impurities into the power semiconductor element formed on the semiconductor substrate SUB. As a result, according to Modification 4, the operation reliability of the power semiconductor element formed in the semiconductor chip CHP can be improved. In addition, since the entire side surface of the semiconductor substrate SUB is covered with the sealing material 111, the entire side surface of the semiconductor substrate SUB is protected by the sealing material 111, so that cracking and chipping of the semiconductor substrate SUB can be suppressed, whereby the manufacturing yield of the semiconductor chip CHP can be improved.

Second Embodiment

Basic Idea in Second Embodiment

In the first embodiment, the idea of performing the accelerated test not in the state of the semiconductor chip but in the state of the semiconductor wafer on the semiconductor chip containing the wide bandgap semiconductor material as the main component, on which it is difficult to perform the accelerated test in the state of the semiconductor chip, and of distinguishing a latent defect has been described. In this regard, in the second embodiment, an approach different from that in the first embodiment is adopted. That is, the basic idea in the second embodiment is an idea of forming an integrated component from a plurality of singulated semiconductor chips and performing an accelerated test in the state of the integrated component.

Specifically, the basic idea in the second embodiment is to integrally cover the plurality of singulated semiconductor chips with the sealing material to form the integrated component, and to perform the accelerated test in the state of the formed integrated component. According to this idea, since the upper end portion (corner portion) of each semiconductor chip is covered with the sealing material, even if a dynamic test is performed in which a high voltage close to the withstand voltage of the power semiconductor element formed in the semiconductor chip is applied to inspect the flowing switching current, it is possible to suppress the occurrence of aerial discharge at the upper end portion. As a result, according to the basic idea in the second embodiment, an appropriate accelerated test can be performed without the occurrence of aerial discharge.

Figure 28:
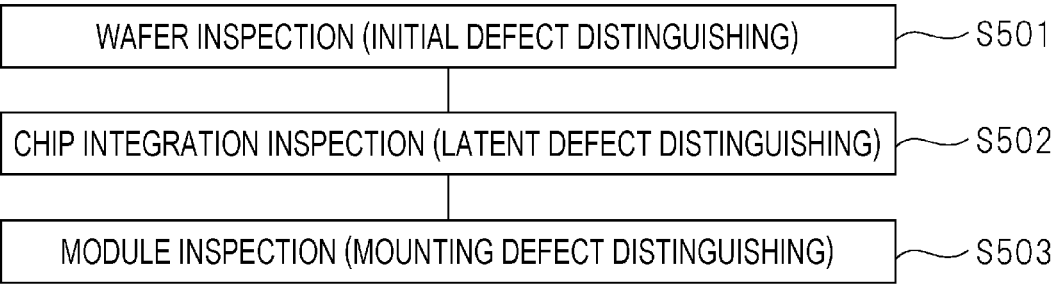
FIG. 28 is a diagram for describing a basic idea in a second embodiment, and is a flowchart illustrating a flow of an inspection process of performing an accelerated test in the state of an integrated component.

For example, FIG. 28 is a diagram for describing the basic idea in the second embodiment, and is a flowchart illustrating a flow of an inspection process of performing the accelerated test in the state of an integrated component. As illustrated in FIG. 28, first, wafer inspection is performed in the state of a semiconductor wafer, and in this wafer inspection, an initial defect is distinguished (S501). Then, a plurality of chip regions formed on the semiconductor wafer are singulated to obtain a plurality of semiconductor chips, and then the integrated component is formed by sealing the plurality of semiconductor chips with the sealing material, and the accelerated test is performed in the state of the integrated component to distinguish a latent defect (S502). Subsequently, the integrated component is divided to manufacture a module (product), and module inspection is performed in the state of the module (S503). In this module inspection, a mounting defect is distinguished.

Here, in embodying the basic idea in the second embodiment, for example, it is conceivable to apply the technology of NPL 1 described in Background Art. NPL 1 describes a technique in which a plurality of semiconductor chips are obtained by dicing a plurality of chip regions of a semiconductor wafer to which a dicing tape is attached, and then the plurality of semiconductor chips arranged on the dicing tape are sealed together with the dicing tape with a resin.

However, the semiconductor element targeted in the second embodiment is a power semiconductor element, and for example, the power semiconductor element is generally operated at a high temperature (175° C. or higher). Therefore, the glass transition temperature of the resin for sealing the semiconductor chip on which the power semiconductor element is formed needs to be 175° C. or higher. This means that the sealing temperature (mold temperature) of the resin needs to be 175° C. or higher.

However, normally, the heat resistant temperature of the dicing tape is 175° C. or lower, and when the step of sealing the semiconductor chip together with the dicing tape with the resin is performed at a mold temperature of 175° C. or higher, the dicing tape does not last. That is, it is difficult to use the technique described in NPL 1 for a semiconductor chip on which a power semiconductor element to be operated at a high temperature is formed. That is, in embodying the basic idea in the second embodiment, it is difficult to apply the technology described in NPL 1, and a new idea is required. Hereinafter, the technical idea in this devised second embodiment will be described.

<Method for Manufacturing Semiconductor Chip>

Figure 29:
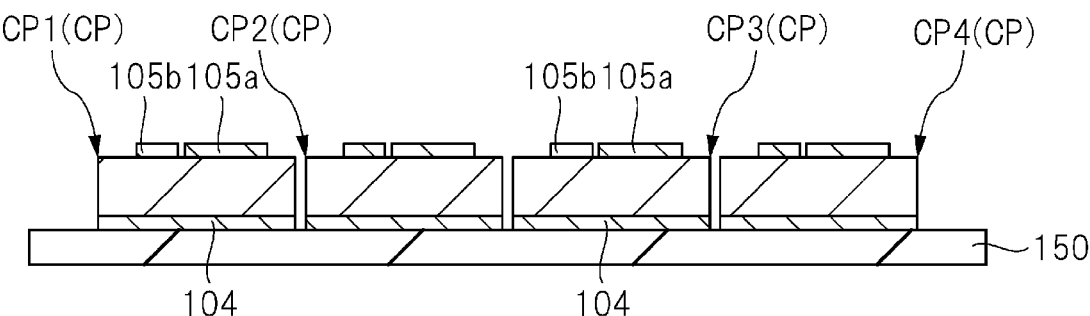
FIG. 29 is a cross-sectional view illustrating a process of manufacturing a semiconductor chip according to the second embodiment.
Figure 30:
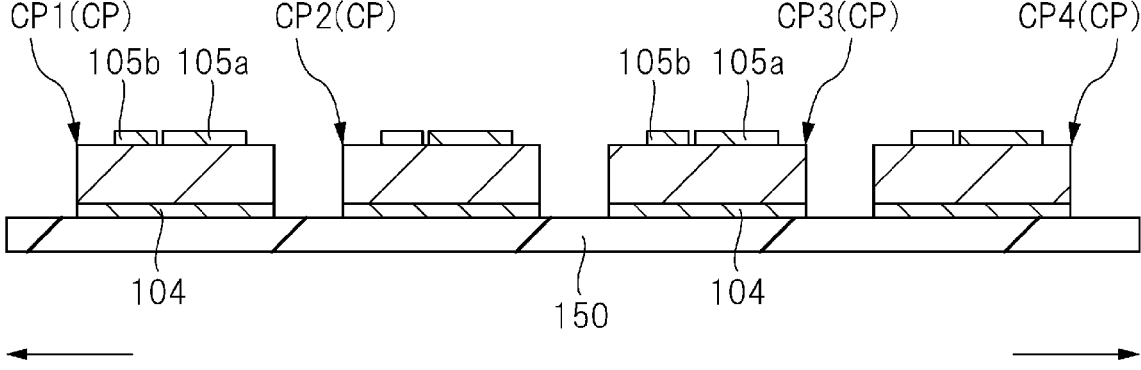
FIG. 30 is a cross-sectional view illustrating a process of manufacturing the semiconductor chip, which is subsequent to FIG. 29.

First, as illustrated in FIG. 29, for example, a semiconductor wafer is diced to obtain a plurality of semiconductor chips CP arranged on a dicing tape 150 at intervals. A back electrode 104, a front electrode 105a, and a control electrode 105b are formed in each of the plurality of semiconductor chips CP. In addition, power semiconductor elements are formed on the plurality of semiconductor chips CP. Next, as illustrated in FIG. 30, the dicing tape 150 is pulled to widen a gap between the semiconductor chips CP adjacent to each other.

Figure 31:
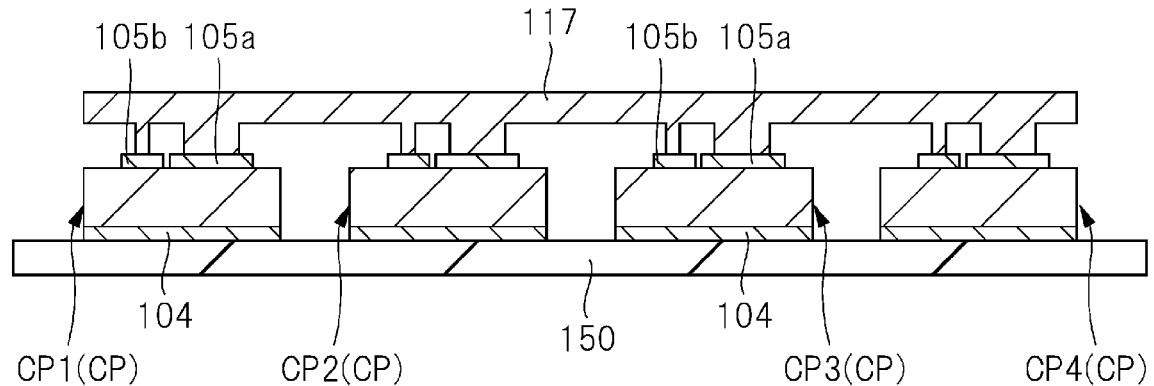
FIG. 31 is a cross-sectional view illustrating a process of manufacturing the semiconductor chip, which is subsequent to FIG. 30.
Figure 32:
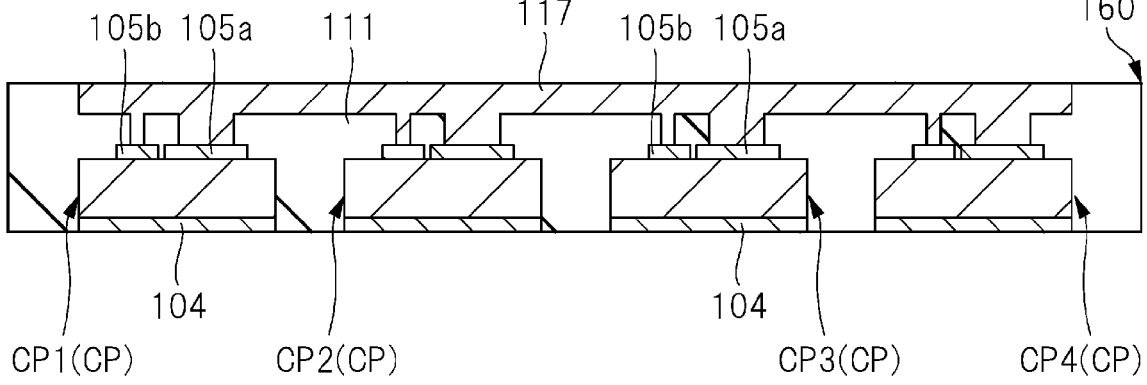
FIG. 32 is a cross-sectional view illustrating a process of manufacturing the semiconductor chip, which is subsequent to FIG. 31.

Subsequently, as illustrated in FIG. 31, an integrated conductor 117 formed of an integrated component is bonded over the plurality of semiconductor chips CP. Then, as illustrated in FIG. 32, after the dicing tape 150 is peeled off, the plurality of semiconductor chips CP to which the integrated conductor 117 is bonded are sealed with the sealing material 111 to form an integrally sealed object 160.

Figure 33:
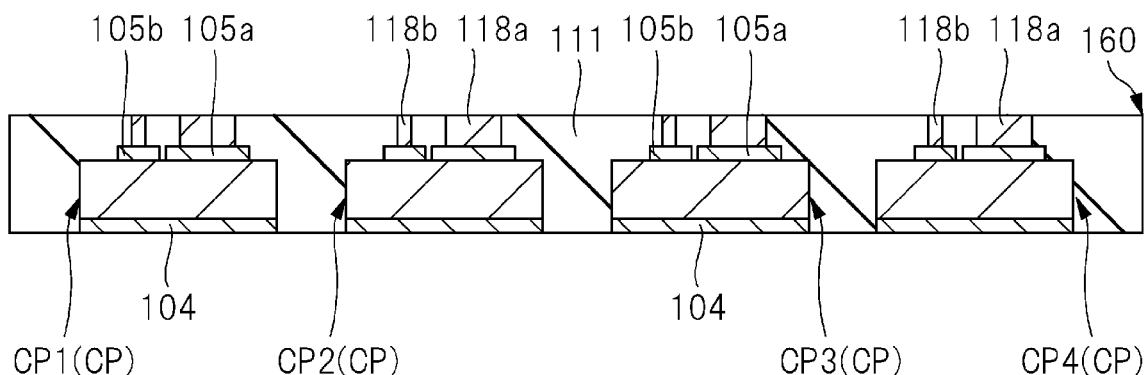
FIG. 33 is a cross-sectional view illustrating a process of manufacturing the semiconductor chip, which is subsequent to FIG. 32.
Figure 34:
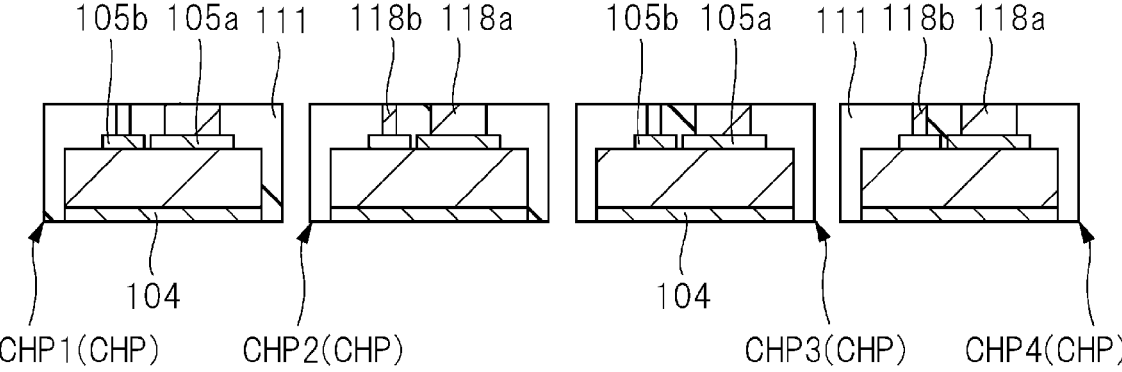
FIG. 34 is a cross-sectional view illustrating a process of manufacturing the semiconductor chip, which is subsequent to FIG. 33.

Next, as illustrated in FIG. 33, the integrated conductor 117 is polished to divide the integrated conductor 117 into a divided conductor 118a and a divided conductor 118b. As a result, the divided conductor 118a bonded to the front electrode 105a and the divided conductor 118b bonded to the control electrode 105b are electrically and physically separated. Then, an accelerated test is performed in the state of the integrally sealed object 160. Thereafter, as illustrated in FIG. 34, the sealing material 111 with which a gap between the semiconductor chips CP adjacent to each other is filled is divided. Thus, a plurality of semiconductor chips CHP can be manufactured.

Features in Second Embodiment

Next, feature points in the manufacturing method in the second embodiment will be described.

A first feature point in the second embodiment is that, for example, as illustrated in FIG. 33, an accelerated test is performed in the state of an integrally sealed object 160 formed by integrally sealing a plurality of semiconductor chips CP obtained by dicing with a sealing material 111. In this case, since the end portion (corner portion) of each of the semiconductor chips CP is covered with the sealing material 111, it is possible to suppress the occurrence of aerial discharge even when the accelerated test using a high voltage close to the breakdown voltage is performed. As a result, in the state of the individual semiconductor chips CP, the accelerated test cannot be appropriately performed due to the occurrence of aerial discharge at the upper end portion (corner portion) of the semiconductor chip CP. However, in the second embodiment, the accelerated test can be collectively performed on the plurality of semiconductor chips CP without the occurrence of aerial discharge by devising to perform the accelerated test on the integrally sealed object 160.

In particular, as illustrated in FIG. 33, since the semiconductor chips CP adjacent to each other in the integrally sealed object 160 are electrically separated by the sealing material 111, even if a power semiconductor element formed in one semiconductor chip is broken in the accelerated test, it is possible to effectively suppress an adverse effect on a power semiconductor element formed in a semiconductor chip adjacent to the semiconductor chip CP.

Next, the second feature point in the second embodiment is that, for example, as illustrated in FIG. 30, an expanding step of expanding a gap between the semiconductor chips CP adjacent to each other is included. As a result, in the dicing step illustrated in FIG. 29, it is not necessary to perform dicing so as to increase the interval between the semiconductor chips CP adjacent to each other. That is, the blade of the dicing blade used in the dicing step illustrated in FIG. 29 can be thinned. This is because the interval between the semiconductor chips CP adjacent to each other can be widened by a necessary amount by pulling the dicing tape 150 in the subsequent expanding step. Therefore, according to the second embodiment, the width of the scribe region can be set to the minimum necessary width in the state of the semiconductor wafer. This means that the ratio of the chip region to the semiconductor wafer can be increased. Therefore, according to the second embodiment, since the number of semiconductor chips CP obtained from one semiconductor wafer can be increased, an effect of reducing the manufacturing cost of the semiconductor chips CP can also be obtained.

Although the invention made by the present inventor has been specifically described based on the embodiments, the present invention is not limited to the embodiments, and it goes without saying that various modifications can be made without departing from the gist of the invention.

The embodiments include the following mode.

(Supplement)

A semiconductor device includes a semiconductor chip containing, as a main component, a wide bandgap semiconductor material having a bandgap larger than that of silicon. The semiconductor chip includes: a semiconductor substrate; a semiconductor element formed on the semiconductor substrate; a front electrode formed on a front surface of the semiconductor substrate; and a back electrode formed on a back surface of the semiconductor substrate. The semiconductor chip further includes: a sealing material that covers an upper corner portion and a side surface of the semiconductor substrate; a first conductor bonded to the front electrode; and a second conductor bonded to the back electrode. The second conductor has a stepped portion formed between a bonding surface between the second conductor and the back electrode and a side surface of the second conductor, and the stepped portion is also filled with the sealing material.

REFERENCE SIGNS LIST

100 power semiconductor device
101 chip mounting portion

102 resin insulating layer
103 metal fin
104 back electrode
105 front electrode
105a front electrode
105b control electrode
106 conductor
107 conductor plate
108 resin insulating layer
109 metal fin
110 sealing material
111 sealing material
112 stepped portion
115 integrated conductor
116 divided conductor
117 integrated conductor
118 divided conductor
118a divided conductor
118b divided conductor
120 conductor
130 stepped portion
150 dicing tape
CHP semiconductor chip
CHP1 semiconductor chip
CHP2 semiconductor chip
CHP3 semiconductor chip
CP semiconductor chip
CP1 semiconductor chip
CP2 semiconductor chip
CP3 semiconductor chip
CP4 semiconductor chip
CR chip region
CR1 chip region
CR2 chip region
CR3 chip region
CR4 chip region
DIT groove
DIT2 groove
SUB semiconductor substrate
WF semiconductor wafer

The invention claimed is:

1. A method for manufacturing a semiconductor device, the method comprising:

a step of performing an accelerated test on each of a plurality of chip regions in a state of a semiconductor wafer containing, as a main component, a wide bandgap semiconductor material having a bandgap larger than that of silicon, and having the plurality of chip regions, wherein the method further comprises (a) a step of bonding a first conductor formed of an integrated component over the plurality of chip regions;

(b) a step of dividing the first conductor into a plurality of first divided conductors along a boundary region that defines the plurality of chip regions, and forming a groove in the boundary region;

(c) a step of filling an inside of the groove and a gap between the first divided conductors adjacent to each other with a sealing material after the step (b), (d) a step of performing the accelerated test after the step (c); and (e) a step of singulating the plurality of chip regions so as to divide the gap filled with the sealing material and the groove filled with the sealing material after the step (d).

2. The method for manufacturing a semiconductor device according to claim 1, wherein the wide bandgap semiconductor material is silicon carbide.

3. The method for manufacturing a semiconductor device according to claim 1, wherein a power semiconductor element is formed in each of the plurality of chip regions.

4. The method for manufacturing a semiconductor device according to claim 3, wherein the accelerated test includes a switching test in a state where a voltage higher than an operating voltage of the power semiconductor elements is applied.

5. A method for manufacturing a semiconductor device, the method comprising:

a step of performing an accelerated test on each of a plurality of chip regions in a state of a semiconductor wafer containing, as a main component, a wide bandgap semiconductor material having a bandgap larger than that of silicon, and having the plurality of chip regions, wherein the method further comprises (a) a step of bonding a first conductor formed of an integrated component to a front surface of the semiconductor wafer;

(b) a step of bonding a second conductor to a back surface of the semiconductor wafer;

(c) a step of dividing the first conductor into a plurality of first divided conductors along a boundary region that defines the plurality of chip regions, and forming a groove in the boundary region;

(d) a step of filling an inside of the groove and a gap between the first divided conductors adjacent to each other with a sealing material after the step (c), (e) a step of performing the accelerated test after the step (d); and (f) a step of singulating the plurality of chip regions so as to divide the gap filled with the sealing material, the groove filled with the sealing material, and the second conductor after the step (e).

6. A method for manufacturing a semiconductor device, the method comprising:

a step of performing an accelerated test on each of a plurality of chip regions in a state of a semiconductor wafer containing, as a main component, a wide bandgap semiconductor material having a bandgap larger than that of silicon, and having the plurality of chip regions, wherein the method further comprises (a) a step of bonding a first conductor formed of an integrated component to a front surface of the semiconductor wafer;

(b) a step of bonding a second conductor to a back surface of the semiconductor wafer;

(c) a step of dividing the first conductor into a plurality of first divided conductors along a boundary region that defines the plurality of chip regions, dividing the boundary region, and forming a groove in the second conductor;

(d) a step of filling an inside of the groove, a first gap between the first divided conductors adjacent to each other, and a second gap between the chip regions adjacent to each other with a sealing material after the step (c);

(e) a step of performing the accelerated test after the step (d); and (f) a step of obtaining a plurality of semiconductor chips by dividing the first gap filled with the sealing material, the second gap filled with the sealing material, the groove filled with the sealing material, and the second conductor after the step (e).

7. A method for manufacturing a semiconductor device, the method comprising:

a step of performing an accelerated test on each of a plurality of semiconductor chips in a state where the plurality of semiconductor chips are integrated, each of the semiconductor chips containing, as a main component, a wide bandgap semiconductor material having a bandgap larger than that of silicon, wherein the method further comprises (a) a step of preparing the plurality of semiconductor chips arranged on a dicing tape;

(b) a step of bonding a first conductor formed of an integrated component on the plurality of semiconductor chips;

(c) a step of peeling the dicing tape after the step (b);

(d) a step of forming an integrally sealed object by sealing the plurality of semiconductor chips to which the first conductor is bonded with a sealing material after the step (c);

(e) a step of dividing the first conductor into a plurality of first divided conductors after the step (d);

(f) a step of performing the accelerated test after the step (e); and (g) a step of dividing the sealing material which is filled between the first divided conductors adjacent to each other and the sealing material which is filled between the semiconductor chips adjacent to each other after the step (f).

8. The method for manufacturing a semiconductor device according to claim 7, the method further comprising a step of widening a gap between the semiconductor chips adjacent to each other between the step (a) and the step (b).

\*   \*   \*   \*   \*